United States Patent [19]

Vinn et al.

[11] Patent Number: 5,061,900
[45] Date of Patent: Oct. 29, 1991

[54] SELF-ZEROING AMPLIFIER

[75] Inventors: Charles L. Vinn, Milpitas; Para K. Segaram, Campbell, both of Calif.

[73] Assignee: Raytheon Company, Lexington, Mass.

[21] Appl. No.: 367,655

[22] Filed: Jun. 19, 1989

[51] Int. Cl.$^5$ .......................... H03F 3/45; H03F 1/02
[52] U.S. Cl. ......................................... 330/9; 330/259
[58] Field of Search ................... 330/9, 259, 261, 307

[56] References Cited
U.S. PATENT DOCUMENTS 4,356,450  10/1982  Masuda ................................. 330/9
4,395,681  7/1983  Hornung et al. ................ 330/261 X Primary Examiner—James B. Mullins
Attorney, Agent, or Firm—Richard M. Sharkansky

[57] ABSTRACT

A precision amplifier that, in response to digital inputs, zeros its offset voltage. The precision amplifier comprises a traditional amplifier; a current source controlled by a counter; a comparator; test switches; and control logic. A digital input, such as might be generated from a microprocessor, initiates the offset adjustment. The test switches disconnect the amplifier inputs from external package connections and connect the inputs together. The counter begins to count, changing the current produced by the current source at each count. The current from the current source is applied to the offset adjust circuit of the amplifier which changes the offset voltage as the current changes. The counter counts until the comparator indicates the offset voltage has been zeroed. Alternative embodiments allow the precision amplifier to adjust for offset introduced by circuitry connected to the input and the output of the precision amplifier.

21 Claims, 4 Drawing Sheets

SELF-ZEROING AMPLIFIER

BACKGROUND OF THE INVENTION

This invention relates generally to amplifiers and more particularly to offset adjustment circuitry in an amplifier.

Many applications require precision amplifiers. For example, data acquisition systems demand very high precision amplifiers.

One type of error in commercially available amplifiers is offset voltage. In a perfect amplifier, the output is zero when the input is zero. In a real amplifier, the output may not be precisely zero even when the input is zero. This deviation from a perfect amplifier is quantified by measuring the "offset voltage" of a real amplifier. With the output of the amplifier at zero volts, the voltage at the input is the offset voltage.

To reduce the problem of offset voltage, many commercially available integrated circuit (IC) amplifiers have pins to which a potentiometer can be connected. Adjusting the resistance of the potentiometer changes the offset voltage. If the potentiometer is properly adjusted, the offset voltage can be set very near zero or "nulled".

Several drawbacks of nulling the offset voltage with a potentiometer exist. A person usually performs the operation, which is often not convenient or cost-effective. Additionally, the offset voltage may change as the operating temperature of the amplifier changes or the amplifier ages. If the offset voltage changes, the amplifier is no longer nulled and an error is introduced.

A method of dynamic offset nulling has been used to avoid errors when the offset voltage changes. This method is called "chopper stabilization". The input to the amplifier is switched rapidly between an input signal and ground. A capacitor is connected to the output. When the input is switched to ground, the capacitor is switched between the output and ground. In this state, the output is at the offset voltage and the capacitor changes to the offset voltage. When the input to the amplifier is switched to the input signal, the capacitor is switched to be in series with the output. The capacitor is switched such that the voltage across the capacitor is subtracted from the output of the amplifier, thereby guaranteeing that the output is at zero volts when the input is at zero volts.

With chopper stabilization, the voltage across the capacitor adjusts if the offset voltage changes. Thus, the errors of adjusting the offset with a potentiometer do not occur. However, chopper stabilization has other drawbacks. Both the input and output constantly switch between the desired output signal and an undefined state. This rapid switching causes discontinuities in the output signal. The discontinuities can be filtered out, but only if the desired signal is of relatively low frequency. Additionally, the rapid switching creates high frequency noise in a system, which can be undesirable.

SUMMARY OF THE INVENTION

It is an object of this invention to provide a precise amplifier.

It is a further object of this invention to provide an amplifier with offset adjustment that can compensate for changes in the offset voltage.

It is yet another object of this invention to provide an integrated circuit chip which can compensate for offset voltage in a system.

The foregoing and other objects are accomplished in an integrated circuit containing an amplifier, control logic, a digital to analog converter (DAC), a counter, and switches. In response to a control input, the control logic switches the inputs of the amplifier to ground and resets the counter. The control logic then increments the digital value applied to the digital to analog converter. The output of the digital to analog converter is connected to the amplifier such that an increase in the digital input to the DAC changes the offset voltage of the amplifier. The digital input to the DAC is incremented by the counter until the control logic determines that the output of the amplifier changes from positive to negative. The control logic then latches the value of the digital input and disconnects the inputs to the amplifier from ground and reconnects them to the input signal.

In one embodiment of the invention, the switches do not directly connect the inputs of the amplifier to ground. Rather, integrated circuit package pins are provided for both the switches and the amplifier inputs. This arrangement allows circuitry to be included between the switch and the amplifier inputs. Any offset voltage generated by that circuitry can also be nulled.

In another embodiment of the invention, the amplifier is constructed on an integrated circuit chip. The logic section contains a comparator which indicates the offset voltage has been nulled when its output changes from positive to negative. The inputs of the comparator are inputs to the integrated circuit chip, allowing any signals to control when the offset voltage has been nulled. This arrangement allows offset induced by components outside the IC chip connected to the output of the amplifier to be nulled.

BRIEF DESCRIPTION OF THE DRAWINGS

This invention will be better understood by reference to the following detailed description and accompanying figures, in which.

DESCRIPTION OF THE PREFERRED EMBODIMENT

Figure 1:
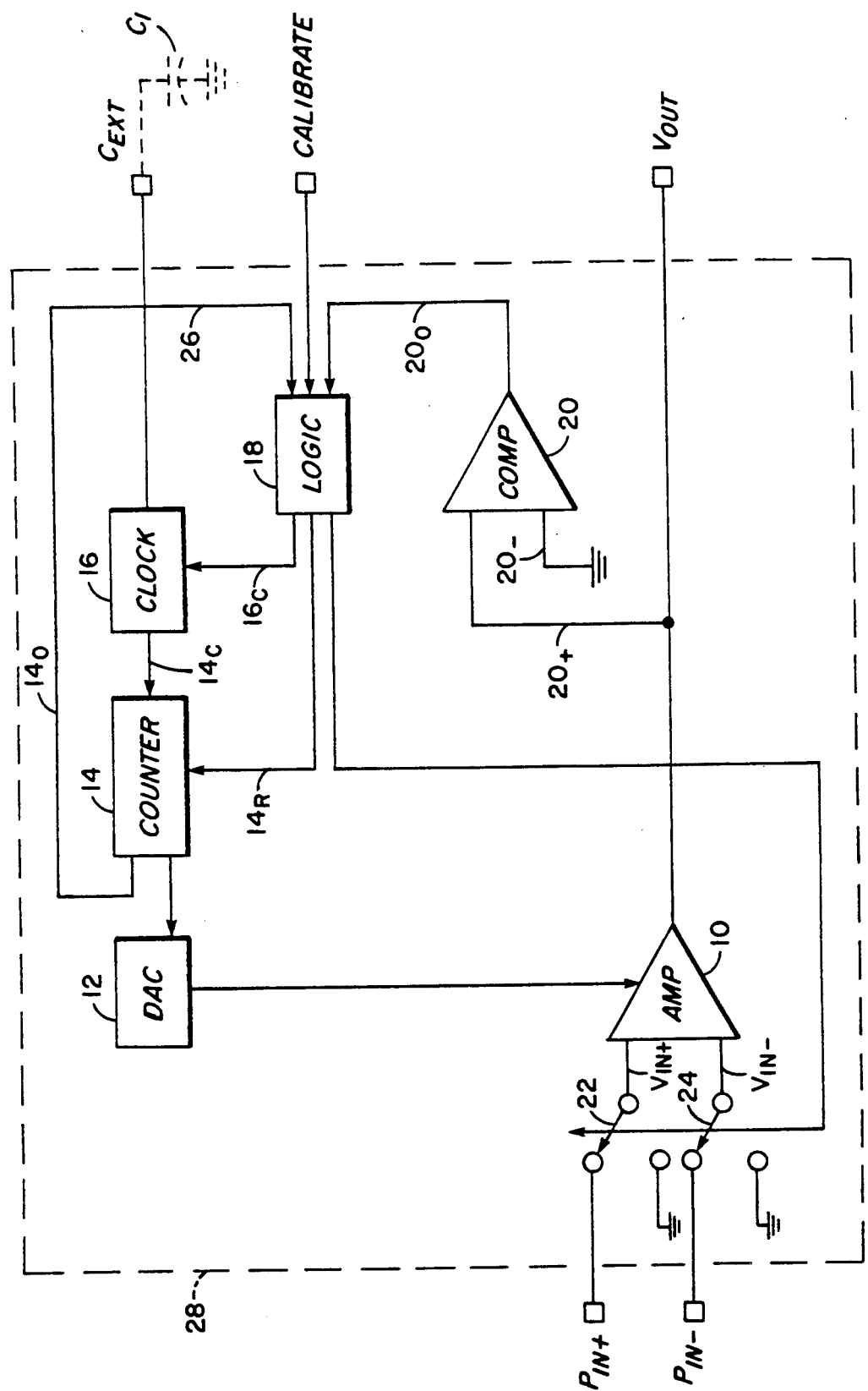
FIG. 1 is a simplified block diagram of an amplifier constructed in accordance with the present invention.

FIG. 1 shows a block diagram of circuitry which forms a precision amplifier 28. Precision amplifier 28 is constructed from known technology. For example, bipolar junction transistors might be connected to form an integrated circuit (IC) chip. The lines $P_{IN+}$, $P_{IN-}$, $C_{EXT}$, CALIBRATE, and $V_{OUT}$ represent signal lines connected to pins outside the package containing the IC chip.

One of skill in the art will appreciate that an IC package contains more pins than are explicitly shown. Pins to provide standard functions in IC circuits are not explicitly shown. For example, no pins are shown for providing power to the IC, but one of skill in the art will recognize that such pins are required. Other standard elements of an IC circuit are not shown, but it will be appreciated that such elements are also required.

Precision amplifier 28 contains an amplifier 10 of known construction. The inputs of amplifier 10 are connected, via switches 22 and 24, to input pins $P_{IN+}$, and $P_{IN-}$. The output of amplifier 10 is connected to output pin $V_{OUT}$.

Figure 2:
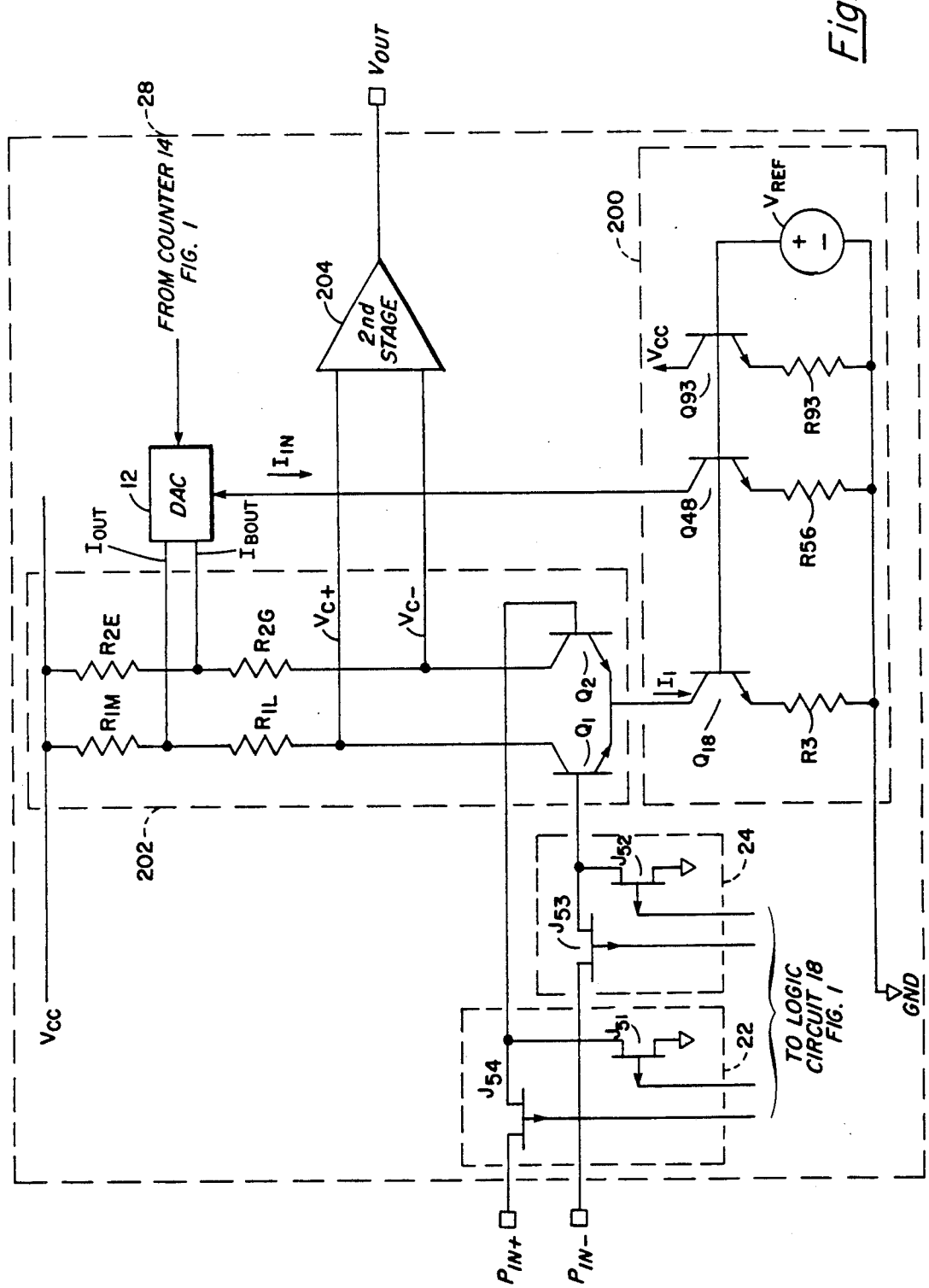
FIG. 2 is a simplified schematic of the offset adjustment features of the amplifier in FIG. 1.

Amplifier 10 is also connected to digital to analog converter (DAC) 12 in a manner described in greater detail in conjunction with FIG. 2. Suffice it to say here that the output of DAC 12 is a current which changes the offset voltage of amplifier 10. Digital to analog converters are well known. Here, DAC 12 is a six-bit converter of known construction.

The digital input of DAC 12 is connected to the output of counter 14. Here, counter 14 is a six-bit counter of known construction. As is known, each time a pulse occurs on count input $14_C$, the digital value stored in counter 14 increases by 1. Counter 14 has latched outputs so the values stored in the counter appears on its output lines until it is changed. Counter 14 is also connected to logic 18 by control input $14_R$. A pulse on control input 14R causes the value stored in counter 14 to be reset to zero.

Counter 14 contains an overflow output $14_O$. Counter 14, having a fixed number of bits, can only count a fixed number of pulses. When counter 14 reaches its maximum i/15 count, overflow output $14_O$ has a value of logic HI. This indicates to logic 18 that counter 14 cannot be incremented further.

The count input $14_C$ to counter 14 is provided by clock 16. Clock 16 is of known construction and produces a pulse train. The period of the pulse train is dictated by the size of capacitor $C_1$ which is outside of the IC package containing precision amplifier 28. Capacitor $C_1$ is connected to clock 16 via pin $C_{EXT}$. Here, $C_1$ is selected to produce a pulse train with a frequency of roughly 200 KHz. Clock 16 also has a control input $16_C$. Clock 16 only produces a pulse train when control input $16_C$ is in a logic HI state.

Control signals to clock 16 and counter 14 are provided by logic 18. Logic 18 contains known circuits configured to perform the logic functions described below.

Another input to logic 18 is provided by comparator 20. Comparator 20 is of known construction. When the value at input $20_+$ exceeds the value at input $20_-$, the output $20_O$ has a logic HI value. When the value at input $20_+$ is less than the value at input $20_-$, the output $20_O$ has a logic LO value. As shown in FIG. 1, input $20_-$ is connected to ground and input $20_+$ is connected to the output of amplifier 10. Thus, the output $20_O$ is a logic HI when the output of amplifier 10 is positive and a logic LO when the output of amplifier 10 is negative. The output $20_O$ switches from logic LO to logic HI (a "LO to HI transition") when the output of amplifier 10 increases until it equals zero.

Actually, comparator 20 is designed to have some hysteresis. This means that input $20_+$ must slightly exceed input $20_-$ for output $20_O$ to switch from LO to HI. Likewise, input $20_-$ must slightly exceed input $20_+$ for output 200 to switch from HI to LO. The hysteresis prevents comparator 20 from generating false signals when there is noise in the system.

In operation, switches 22 and 24 normally couple the inputs of amplifier 10 to the pins $P_{IN+}$ and $P_{IN-}$. Logic 18 is inactive and precision amplifier 28 operates, in this normal state, like an amplifier of the prior art.

Precision amplifier 28 may be placed in a "calibrate mode" of operation by a logic HI signal on input pin CALIBRATE. In the calibrate mode, the input offset voltage is nulled. When a logic HI signal should be placed on the CALIBRATE pin is determined by the use of precision amplifier 28. For example, if precision amplifier 28 is used in a microprocessor controlled data acquisition system, the microprocessor (not shown) will apply a logic HI to the CALIBRATE pin at appropriate times. Appropriate times might be when power is first applied to the system or before the system acquires data, or after every five minutes of operation.

In the calibrate mode, logic 18 controls the various components of precision amplifier 28 to null the offset. First, logic 18 operates switches 22 and 24 to connect them to their grounded terminals. This connects the inputs of amplifier 10 to ground. Logic 18 also generates a signal on line $14_R$ to reset counter 14 to zero.

Logic 18 then places a signal on control input $16_C$ to start clock 16 producing a pulse train. At each pulse, the value in counter 14 increments and the current out of DAC 12 changes. The change in current out of DAC 12 in turn changes the output voltage of amplifier 10. When the current from DAC 12 reaches a value which nulls the offset, output $20_O$ of comparator 20 has a LO to HI transition.

Logic 18 detects this transition and places a signal on line $16_C$ which stops clock 16 from generating a pulse train. Logic 18 then generates signals which connect switches 22 and 24 as they were in the normal mode. Precision amplifier 28 is then operating as a normal amplifier except that the current from DAC 12 nulls the offset voltage.

It is possible that the maximum value in counter 14 will not completely null the offset voltage. In that case, the counter will reach its maximum value and the overflow line $14_O$ will go HI. If logic 18 detects a logic HI on overflow line $14_O$, it will return precision amplifier to the normal mode in the same fashion as when comparator 20 indicated the offset voltage had been nulled. However, when the calibration mode ends because of the value of overflow line $14_O$, the offset is not completely nulled. Rather, it is as close to being nulled as the circuitry of precision amplifier 28 can achieve.

Turning now to FIG. 2, additional details can be seen of how DAC 12 controls the offset voltage. FIG. 2 shows in simplified schematic form the input stage 202 of the amplifier 10. Input stage 202 is coupled to a second stage 204 which in turn is coupled to the output pin $V_{OUT}$. Second stage 204 is any known second stage of an amplifier. Input stage 202 contains a pair of bipolar junction transistors $Q_1$ and $Q_2$. The collectors of transistors $Q_1$ and $Q_2$ are connected to the positive supply $V_{CC}$ through resistors $R_{1L}$, $R_{1M}$, $R_{2E}$ and $R_{2G}$. The emitters of transistors $Q_1$ and $Q_2$ are connected together and connected to a lead of current source 200.

Input stage 202 is a traditional differential input stage. Current source 200 produces a current $I_I$. The current $I_I$ splits such that part flows through transistor $Q_1$ and part flows through transistor $Q_2$. Ideally, when more current flows through transistor $Q_2$, the voltage at line $V_{C+}$ exceeds the voltage on line $V_{C-}$. Conversely, when the current through transistor $Q_1$ exceeds the current through transistor $Q_2$, the voltage at line $V_{C-}$ exceeds the voltage at line $V_{C-}$. In this way, the output voltage changes in response to the currents through transistors $Q_1$ and $Q_2$.

When the currents through transistors $Q_1$ and $Q_2$ are equal, the output voltage on pin $V_{OUT}$ would be zero if the resistors $R_{1M}$ and $R_{2E}$, $R_{1L}$ and $R_{2G}$ and transistors $Q_1$ and $Q_2$ were identical (sometimes called "perfectly matched"). If the components of the amplifier were perfectly matched, a zero differential voltage between pins $P_{IN+}$ and $P_{IN-}$ would produce the same current through transistors $Q_1$ and $Q_2$ and hence a zero output voltage. Of course, the components of precision amplifier 28 cannot be perfectly matched and some voltage will result on pin $V_{OUT}$ even if the input voltage is zero. This resulting voltage represents offset voltage.

As described above, the voltage at pin $V_{OUT}$ can be adjusted by adjusting the relative currents between transistors $Q_1$ and $Q_2$. DAC 12 is connected to input stage 202 to adjust those currents. As seen, DAC 12 has two current outputs $I_{OUT}$ and $I_{BOUT}$ and one current input $I_{IN}$. DAC 12 works in a conventional fashion. Namely, the input current $I_{IN}$ is divided between the output lines $I_{OUT}$ and $I_{BOUT}$ in proportion to the value of the digital input from counter 14. If the digital input is zero, the current $I_{IN}$ will flow through output $I_{BOUT}$ and no current will flow through line $I_{OUT}$. When the digital input has its maximum value, the current $I_{IN}$ will flow through line $I_{OUT}$ and no current will flow through line $I_{BOUT}$. When the digital input has its middle value, equal amounts of current flow through lines $I_{OUT}$ and $I_{BOUT}$. For other values of the digital input, some current will flow through each line in proportion to the value.

The manner in which DAC 12 can adjust the offset voltage can thus be seen. The value of current $I_{IN}$ is selected so that when applied to input stage 202 on line $I_{BOUT}$, it lowers the output voltage by at least the amount of the expected offset voltage to be nulled. Thus, when counter 14 has a value of zero after precision amplifier 28 enters calibrate mode, the output $V_{OUT}$ should be less than the desired value. When counter 14 counts up, the output $V_{OUT}$ should increase to the desired value.

FIG. 2 also shows other details of the construction of precision amplifier 28. Current source 200 is seen to be implemented with a circuit known as a current mirror. The base of transistor $Q_{93}$ is connected to a precise voltage reference $V_{REF}$ implemented in any known manner. The collector of transistor $Q_{93}$ is connected to the positive supply $V_{CC}$. The emitter of transistor $Q_{93}$ is connected to ground via resistor $R_{93}$. The current through transistor $Q_{93}$ is relatively precisely controlled. Since the bases of transistors $Q_{18}$ and $Q_{48}$ are tied to the base of transistor $Q_{93}$, the currents through transistors $Q_{18}$ and $Q_{48}$ "mirror" the current in transistor $Q_{93}$. The transistors $Q_{18}$, $Q_{48}$ and $Q_{93}$ and resistors $R_3$, $R_{56}$ and $R_{93}$ can be made different sizes such that the currents in each transistor are different. However, the currents in transistors $Q_{18}$, $Q_{48}$ and $Q_{93}$ will be relatively stable and, if any of the currents change, the rest of the currents exhibit proportionate change.

This proportionate change is significant because currents $I_I$ and $I_{IN}$ are both produced by current source 200. If current $I_I$ were to change, say because precision amplifier 28 heated up during use, the offset voltage might increase. Here, however, an increase in $I_I$ is mirrored by an increase in $I_{IN}$, which increases the offset compensation. Thus, the offset voltage tends to stay nulled as precision amplifier 28 operates.

FIG. 2 also shows details of the construction of switches 22 and 24. Here, the switches are implemented using junction field effect transistors $J_{51}$, $J_{52}$, $J_{53}$, $J_{54}$.

Figure 3:
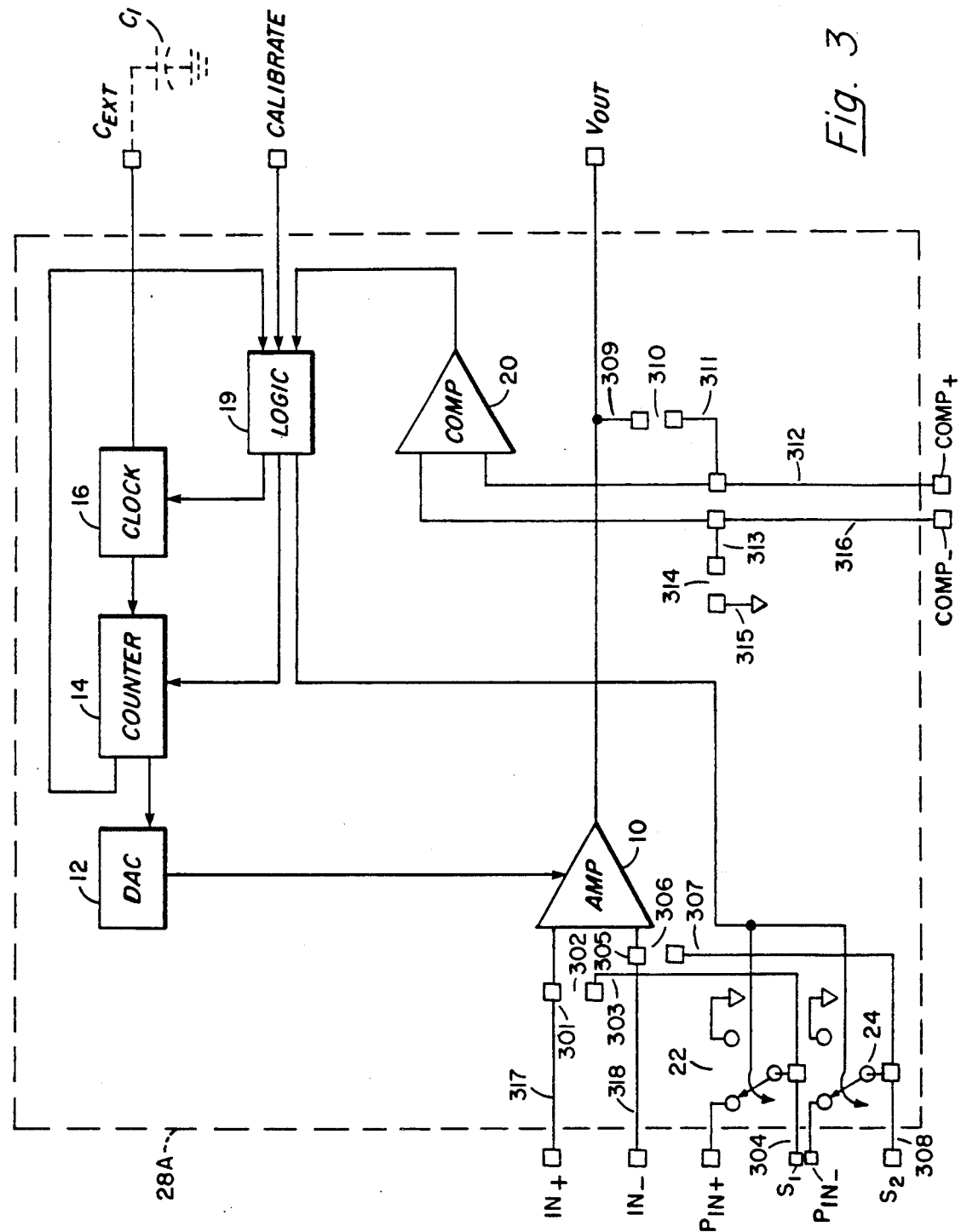
FIG. 3 is a simplified block diagram of an alternative embodiment of the invention.

Turning now to FIG. 3, an additional feature of the present invention may be seen. When precision amplifier 28 is fabricated on an IC chip, the inputs to comparator 20 and switches 22 and 24 can be connected to pins on the package containing the IC chip. These connections, as will be describe in conjunction with FIGS. 4A and 4B, allow precision amplifier 28 to null offsets created by sources external to precision amplifier 28.

The inputs of amplifier 10 are connected to pins $IN_+$ and $IN_-$ via lines 317 and 318. Switches 22 and 24 are connected to pins $S_1$ and $S_2$. In FIG. 1, lines 317 and 318 are not present. Rather, the same inputs of amplifier 10 are connected to switches 22 and 24. To connect the inputs to switch 22 and 24, the gaps 302 and 306 could be filled and lines 317, 318, 304 and 308 could be omitted.

Likewise in FIG. 3, the inputs of comparator 20 are connected to pins COMP. and $COMP_+$. In FIG. 1, the inputs of comparator 20 are connected to $V_{OUT}$ and ground. In FIG. 3, the connection to the pins is made by lines 312 and 316. To connect the inputs of comparator 20 to ground and $V_{OUT}$, the lines 312 and 316 can be omitted and gaps 310 and 314 can be filled.

In integrated circuit fabrication, selective connection of certain portions of a circuit is well known. Integrated circuits are customized by changing the final metallization layer in which many components are connected. To fill a gap, a line is added to the metallization. To omit a line, the corresponding portion of the metallization is removed. In addition, when an integrated circuit chip is connected to pins of a package (a process called "bonding"), different portions of the circuit can be connected to the pins. In comparison to the expense and effort needed to fabricate an integrated circuit, small changes in the last metallization layer or the bonding process are simple.

Figure 4A:
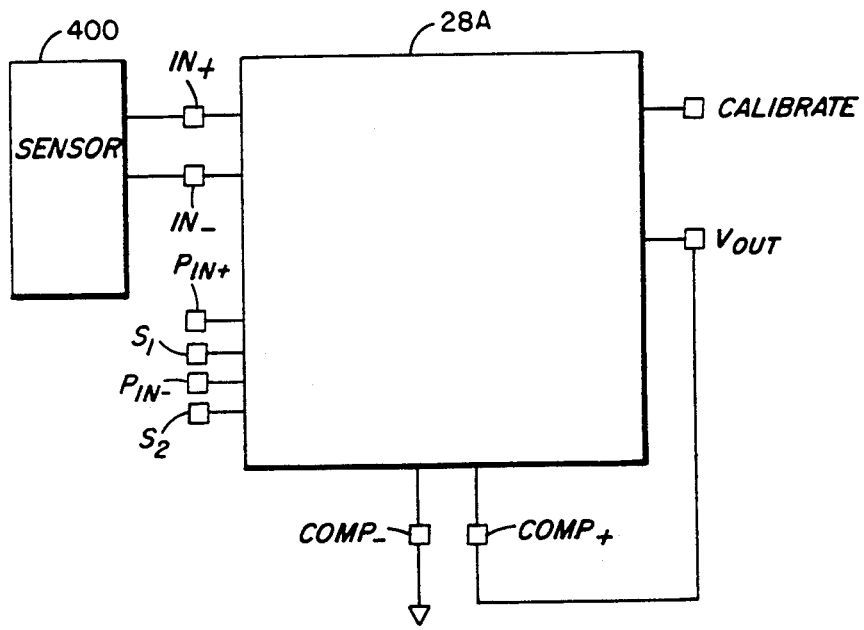
FIG. 4A is a block diagram indicating how the amplifier of FIG. 3 can be connected to null offset voltage introduced by components connected to the input of the amplifier.
Figure 4B:
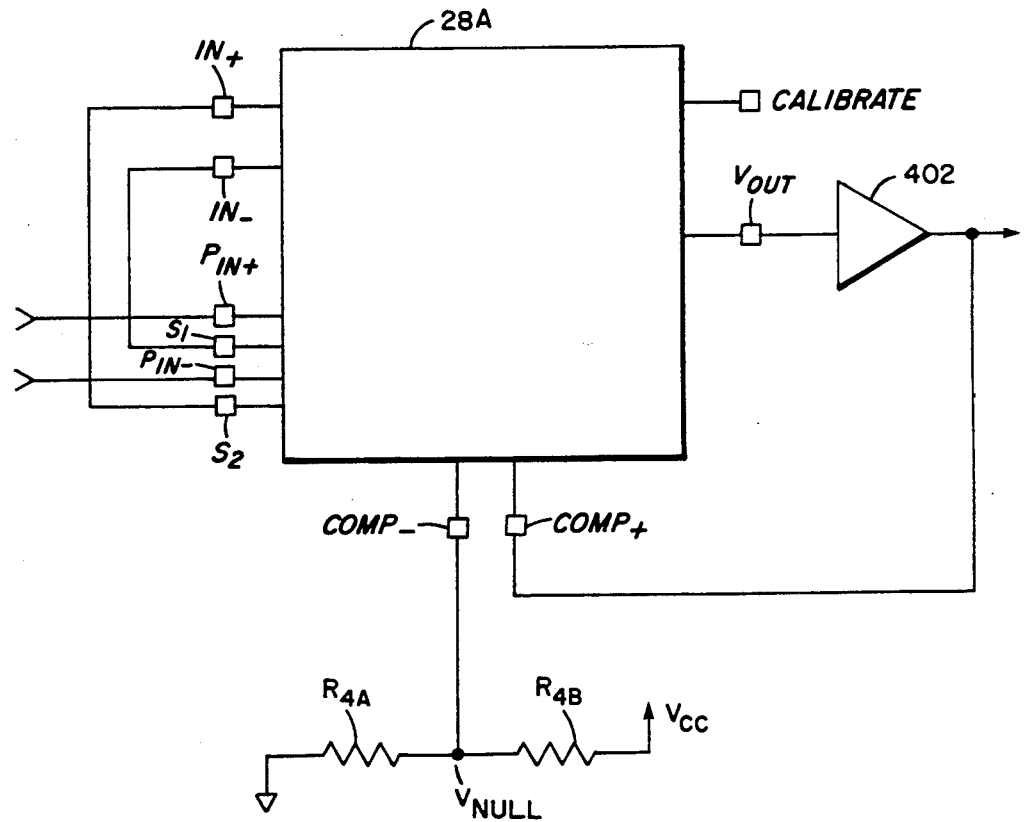
FIG. 4B is a block diagram indicating how the amplifier of FIG. 3 can be connected to null offset voltage introduced by components connected to the input of the amplifier.

The advantages of configuring precision amplifier 28 as shown in FIG. 3 can be seen by reference to FIGS. 4A and 4B. FIG. 4A shows precision amplifier 28A used to amplify the output of some circuits. For example, precision amplifier 28A could be used to amplify the output of a strain gauge sensor 400.

The offset voltage at pin $V_{OUT}$ could be due to imprecise matching of components inside the precision amplifier 28. In addition, sensor 400 could add a component to the offset voltage. To fully null the offset, precision amplifier 28A should compensate for both sources of error.

Since precision amplifier 28 is only placed in calibrate mode by an appropriate signal on the CALIBRATE line, it is not always necessary to connect the inputs of amplifier 10 to ground when nulling an offset voltage. In particular, if precision amplifier 28 is only placed in calibrate mode when the input to the amplifier is supposed to be zero, there is no need to ground the inputs. Consequently, strain gauge sensor 400 is connected directly to inputs $IN+$ and $IN_-$ rather than being connected via switches 22 and 24 (FIG. 3). During the nulling, then, strain gauge sensor is connected to the inputs of amplifier 10 (FIG. 3) and any offset introduced by that component is nulled.

The extent to which precision amplifier 28A can be used to null offset voltage attributed to circuits connected to the inputs of precision amplifier 28A depends on the extent to which a time can be identified when the expected output of precision amplifier 28A is known. In the circuit of FIG. 4A, that known output value is zero and the microprocessor or the other control means connected to the CALIBRATE line does not initiate calibration mode unless the system incorporating precision amplifier 28A is in a state which should produce a zero output.

It is also possible to null the offset of precision amplifier 28A when the expected output voltage of precision amplifier 28A is other than zero. From the foregoing description, it can be seen that comparator 20 (FIG. 3) indicates precision amplifier 28A is nulled when the voltage at pin COMP$_-$ equals the voltage at pin COMP$_+$. FIG. 4B shows a resistor voltage divider comprising resistors $R_{4A}$ and $R_{4B}$ used to place a voltage of $V_{NULL}$ at pin COMP$_-$. For the circuit of FIG. 4B, precision amplifier 28A is placed in calibrate mode only when the voltage connected to pin COMP$_+$ is expected to equal $V_{NULL}$.

When amplifier 28A is used in the configuration of FIG. 4B, the voltage applied to pin COMP$_+$ is from the output of circuitry 402 connected to pin $V_{OUT}$. In this fashion, precision amplifier 28A can null offset introduced by circuitry 402 in addition to offset introduced by precision amplifier 28A.

It should be noted in FIG. 4B that inputs to precision amplifier 28A are connected to pins IN$_+$ and IN$_-$ via switches 22 and 24. The connections shown in FIG. 4B achieve the same connections between pins $P_{IN+}$ and $P_{IN-}$ and amplifier 10 as shown in FIG. 1.

Having described several embodiments of this invention, it will be apparent to one of skill in the art that various modifications can be made to the disclosed embodiment. For example, alternative layouts of input stage or switches could be employed. It is felt, therefore, that this invention should be limited only by the spirit and scope of the appended claims.

What is claimed is:

1. An operational amplifier comprising:
   a) an amplifier having: an input node; at least one amplifier stage responsive to a signal fed to the input node; and means, coupled to an output of the amplifier stage, for producing a voltage at the output of the amplifier, such voltage being related to the signal fed to the input node, such output voltage producing means having at last one circuit node; and
   b) means, responsive to the voltage produced at the output of the amplifier, for producing a control signal, such control signal changing the voltage produced at the output of the amplifier until such output voltage has a predetermined value, said control signal being applied to the circuit node.

2. The operational amplifier of claim 1 wherein the means for producing a control signal comprises:
   a) digital to analog converter means, responsive to a digital input signal, for providing the control signal; and
   b) logic means, responsive to the voltage produced at the output of the amplifier for generating the digital input signal for the digital to analog converter means.

3. The operational amplifier of claim 2 wherein the logic means comprises:
   a) counter means, having a first input fed by a first logic signal and a second input fed by a source of clock pulses, for counting the clock pulses when the first logic signal is in a first state and for producing the digital input signal, such digital input signal being representative of the counted clock pulses;
   b) a comparator having a first input, a second input, and an output, the output producing a second logic signal, wherein the second logic signal is in a first state when the voltage at the first input exceeds the voltage at the second input by a predetermined amount and the second logic signal is in a second state when the voltage at the second input exceeds the voltage at the first input by a predetermined amount; and
   c) a logic circuit, responsive to the second logic signal and having an output connected to the first input of the counter, said logic circuit providing said first logic signal in the first state when the second logic signal is in the first state.

4. The operational amplifier of claim 3 wherein:
   a) the first input of the comparator is connected to the output of the amplifier; and
   b) the second input of the comparator is connected to ground.

5. The operational amplifier of claim 3 additionally comprising switch means for coupling the input of the amplifier to either amplifier stage or to ground selectively in accordance with a calibration mode signal.

6. The operational amplifier of claim 3 wherein the counter comprises an up counter.

7. The operational amplifier recited in claim 1 wherein the input node has a pair of input terminals and the amplifier stage is a differential amplifier, and wherein the operational amplifier comprises means for placing the operational amplifier in an offset voltage calibration mode with equal voltage being applied to the pair of input terminals, and wherein the control signal producing means produces the control signal with a level of voltage sufficient to produce a zero voltage at the output of the amplifier when the operational amplifier is placed in the offset voltage calibration mode.

8. The operational amplifier recited in claim 1 wherein said at least one amplifier stage comprises a pair of transistors, each of said transistors having a control electrode and wherein the control electrode of one of said transistors is coupled to said input node.

9. The operational amplifier recited in claim 8 wherein said output voltage producing means comprises a pair of resistors coupled between the second electrodes of the pair of transistors and said circuit node.

10. The operational amplifier recited in claim 9 wherein the operational amplifier comprises means for placing the operational amplifier in an offset voltage calibration mode with equal voltages being applied to the pair of control electrodes of the transistors and wherein the control signal producing means produces the control signal with a level of voltage sufficient to produce a zero voltage at the output of the amplifier when the operational amplifier is placed in the offset voltage calibration mode.

11. A differential amplifier of the type having an inverting an a non-inverting input terminal comprising:
   a) an amplifier with an input stage, the input stage comprising a first circuit path and a second circuit path distinct from the inverting and non-inverting terminals, the output of the amplifier being proportional to the difference in current in the first and second circuit paths; and
   b) a digital to analog converter having a first current output, a second current output, a current input, and a digital input, the current in the first and second current outputs equaling the current input divided in proportion to the digital input, wherein the first current output is connected to the first circuit path, and the second current output is connected to the second circuit path.

12. The differential amplifier of claim 11 additionally comprising:
   a) a current source providing current to
      i) the input stage producing a first reference current which is divided between the first circuit path and the second circuit path; and
      ii) the current input of the digital to analog converter.

13. The differential amplifier of claim 12 wherein:
   a) the current provided to the input stage is regulated by a first transistor with a control electrode;
   b) the current provided to the digital to analog converter is regulated by a second transistor with a control electrode; and
   c) the control electrodes of the first transistor and second transistor are coupled together.

14. The differential amplifier of claim 12 wherein the current provided to the input stage and the current provided to the digital to analog converter are coupled such that a change in either current causes a change in the other current.

15. The differential amplifier of claim 11 additionally comprising:
   a) means, coupled to the digital input of the digital to analog converter, for generating a digital value, said means comprising:
      i) a counter;
      ii) means for controlling the counter, said means, in response to a control input, setting the value in the counter to a known state and changing the value until the output of the amplifier reaches a predetermined value.

16. An integrated circuit of the type containing an electronic circuit inside a package with connections made to the circuit via pins in the package, said circuit comprising:
   a) an amplifier having an output connected to a first package pin;
   b) means, coupled to the amplifier, for adjusting the output voltage of the amplifier;
   c) a switch;
   d) a comparator;
   e) logic means, responsive to an input signal coupled to a second package pin and responsive to an output of the comparator, for controlling the switch and the means for adjusting the output voltage 17. The integrated circuit of claim 16 wherein an input of the amplifier is coupled to a third package pin via the switch.

18. The integrated circuit of claim 16 wherein the switch selectively couples and decouples the input of the amplifier to the third package pin and to a reference voltage.

19. The integrated circuit of claim 16 wherein an input of the comparator is connected to the output of the amplifier.

20. The integrated circuit of claim 16 wherein the switch is connected to a third package pin and the input of the amplifier is connected to a fourth package pin.

21. The integrated circuit of claim 16 wherein the input of the comparator is connected to a third package pin.

* * * * *

UNITED STATES PATENT AND TRADEMARK OFFICE
CERTIFICATE OF CORRECTION

PATENT NO. : 5,061,900
DATED : Oct. 29, 1991
INVENTOR(S) : Charles L. Vinn, Para K. Segaram It is certified that error appears in the above-identified patent and that said Letters Patent is hereby corrected as shown below:

Column 7:

Claim 1, line 52, delete "last" and replace with

--least--.

Signed and Sealed this

Second Day of March, 1993

Attest:

STEPHEN G. KUNIN

*Attesting Officer*     Acting Commissioner of Patents and Trademarks